(12) United States Patent
Ker et al.

(10) Patent No.: US 8,649,135 B2
(45) Date of Patent: Feb. 11, 2014

(54) ON-CHIP NOISE FILTER CIRCUIT

(75) Inventors: Ming-Dou Ker, Hsinchu (TW);
Cheng-Cheng Yen, Hsinchu (TW);
Tung-Yang Chen, Sinshih Township,
Tainan County (TW)

(73) Assignees: National Chiao-Tung University,
Hsinchu (TW); **Himax Technologies
Limited**, Sinshih Township, Tainan
County (TW)

( * ) Notice: Subject to any disclaimer, the term of this patent is extended or adjusted under 35 U.S.C. 154(b) by 459 days.

(21) Appl. No.: 13/050,157

(22) Filed: Mar. 17, 2011

(65) Prior Publication Data

US 2012/0236445 A1    Sep. 20, 2012

(51) Int. Cl.
*H02H 9/00* (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS

| | | | | |
|---|---|---|---|---|
| 6,639,483 B2 * | 10/2003 | Chou | .............................. | 332/109 |
| 7,573,012 B1 * | 8/2009 | Huang et al. | ................... | 250/205 |
| 8,466,668 B2 * | 6/2013 | Cross | .............................. | 323/282 |

* cited by examiner

*Primary Examiner* — Stephen W Jackson
(74) *Attorney, Agent, or Firm* — McClure, Qualey & Rodack, LLP

(57) ABSTRACT

A noise filter circuit for an IC is provided. The noise filter circuit comprises a decoupling unit coupled to a power pad of the IC and a current amplifier circuit coupled to the decoupling unit and the power pad of the IC. The decoupling unit generates a first current in response to a transient voltage being on the power pad of the IC. The current amplifier circuit drains a second current from the power pad of the IC according to the first current.

14 Claims, 9 Drawing Sheets

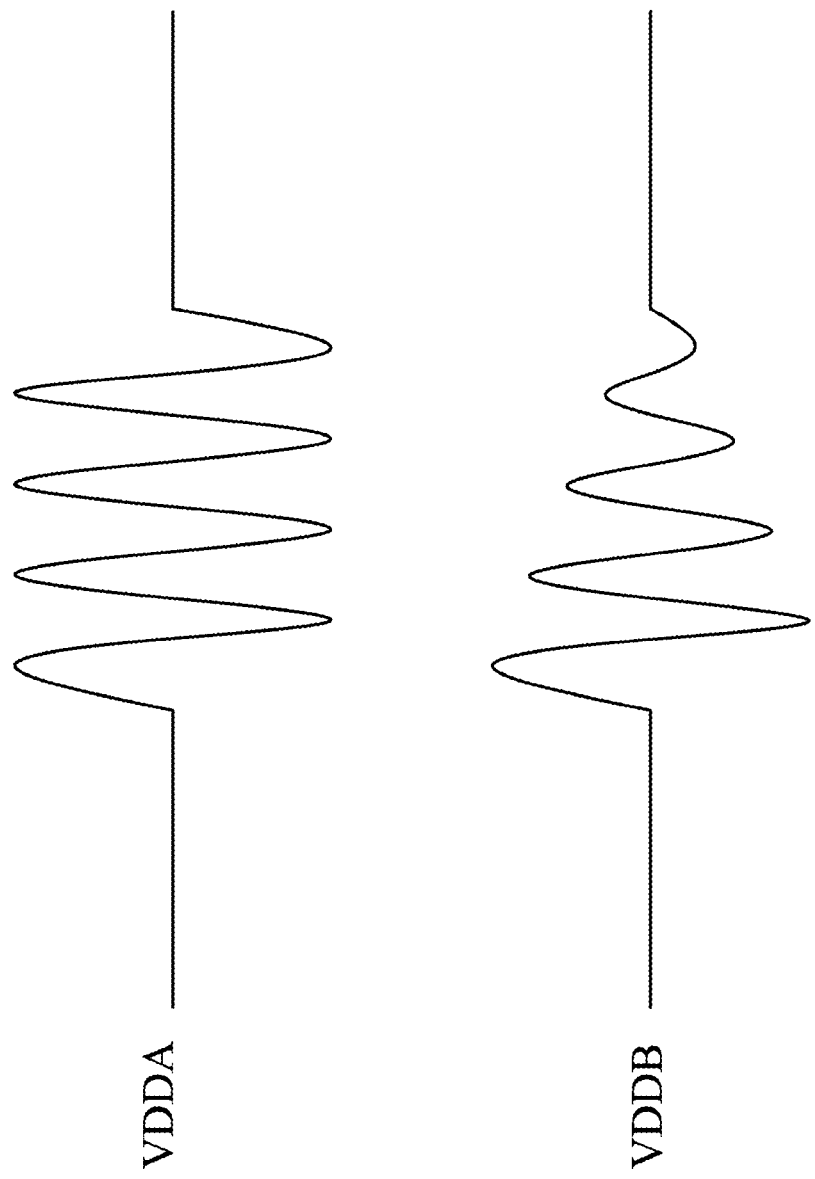

ON-CHIP NOISE FILTER CIRCUIT

BACKGROUND OF THE INVENTION

1. Field of the Invention

The present invention is related to an on-chip noise filter circuit, and more particularly to a noise filter circuit for decoupling transient voltage being on power lines of an integrated circuit.

2. Description of the Related Art

An electrostatic discharge (ESD) event is an important reliability issue for integrated circuits (ICs). To meet component-level ESD reliability, on-chip ESD protection circuits are implemented in the I/O cells and power/ground cells of CMOS ICs. Besides the component-level ESD issue, the system-level ESD issue has been an increasingly significant reliability issue for CMOS IC products, which resulted from strict reliability test standard requirements, such as system-level ESD tests for electromagnetic compatibility (EMC) regulations. In general, an electrical product must sustain an ESD level of +8 kV under a contact-discharge test mode and +15 kV under an air-discharge test mode, so as to meet "level 4" immunity requirements. However, a high energy ESD will induce noise, thus causing damage or malfunction to CMOS ICs of electrical products. Furthermore, some CMOS ICs are very susceptible to system-level ESD stress, even though the CMOS ICs have passed the component-level ESD specifications, such as having a human-body-model (HBM) of ±2 kV, a machine-model (MM) of ±200V, and a charged-device-model (CDM) of ±1 kV.

For comprehensive component-level ESD verification, two ESD tests with a pin-to-pin ESD stress and a VDD-to-VSS ESD stress are performed to verify ESD reliability for an IC chip. The two ESD testing modes often lead to damage in internal/core circuits of IC chips, as some unanticipated ESD currents flow into the internal/core circuits through I/O pins and power lines. Therefore, a noise filter circuit coupled between VDD and VSS power lines is necessary for whole-chip ESD protection. The noise filter circuit can further provide a low impedance path between VDD and VSS power lines to efficiently discharge ESD current when an input (or output) pin is zapped under positive-to-VSS (PS-mode) or negative-to-VDD (ND-mode) ESD stresses.

To meet system-level ESD specifications, some methods are provided to integrate a plurality of discrete noise-decoupling components or board-level noise filters into a CMOS IC product, so as to decouple, bypass, or absorb the electrical transient voltages (energy) under system-level ESD tests. The noise filter circuit, such as a capacitor filter, ferrite bead, transient voltage suppressor (TVS), LC-like (2nd-order), and pi-section (3rd-order) filters, can be used to increase system-level ESD immunity, as shown in FIGS. 1A-1D. In FIGS. 1A-1D, the noise filter circuits 100A-100D are formed by the resistors R and decoupling capacitors C with various structures.

System-level ESD immunity of CMOS ICs under system-level ESD tests can be greatly improved by choosing proper noise filter circuits. Typically, large area/size discrete noise-bypassing components within the noise filter circuits can provide better effect for system-level ESD immunity. However, it is hard to integrate the large discrete components into a single chip due to process limitations, die size requirements, and total cost requirements.

Therefore, to meet high system-level ESD specifications, a chip-level noise filter having strong transient disturbance bypassing capability without requirement a large area is desired.

BRIEF SUMMARY OF THE INVENTION

A noise filter circuit and an integrated circuit (IC) are provided. An embodiment of a noise filter circuit for an IC is provided. The noise filter circuit comprises a decoupling unit coupled to a power pad of the IC and a current amplifier circuit coupled to the decoupling unit and the power pad of the IC. The decoupling unit generates a first current in response to a transient voltage being on the power pad of the IC. The current amplifier circuit drains a second current from the power pad of the IC according to the first current.

Furthermore, an embodiment of an IC is provided. The IC comprises a power pad, a core circuit and a noise filter. The noise filter comprises a decoupling unit coupled to the power pad, generating a first current in response to a transient voltage being on the power pad; and a current amplifier circuit coupled to the decoupling unit and the power pad, draining a second current from the power pad according to the first current.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 4 shows an example diagram of FIG. 3 illustrating a system-level ESD transient through simulation with an underdamped sinusoidal voltage source.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1B:
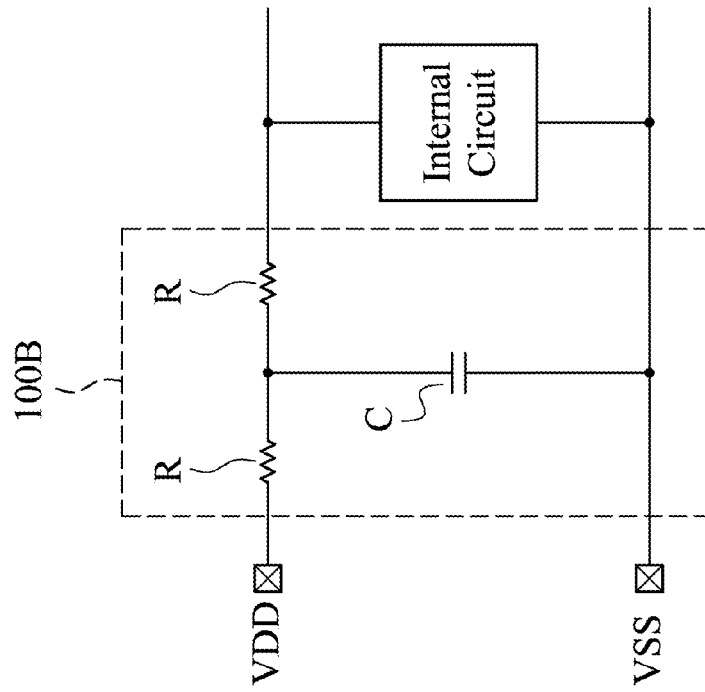
FIGS. 1A-1D show conventional noise filter circuits, respectively.
Figure 1A:
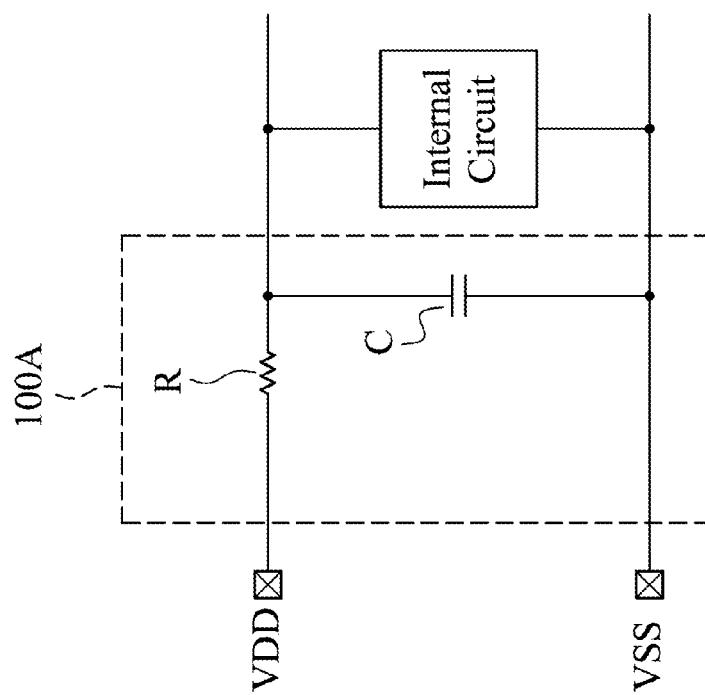
Figures 1C, 1D:
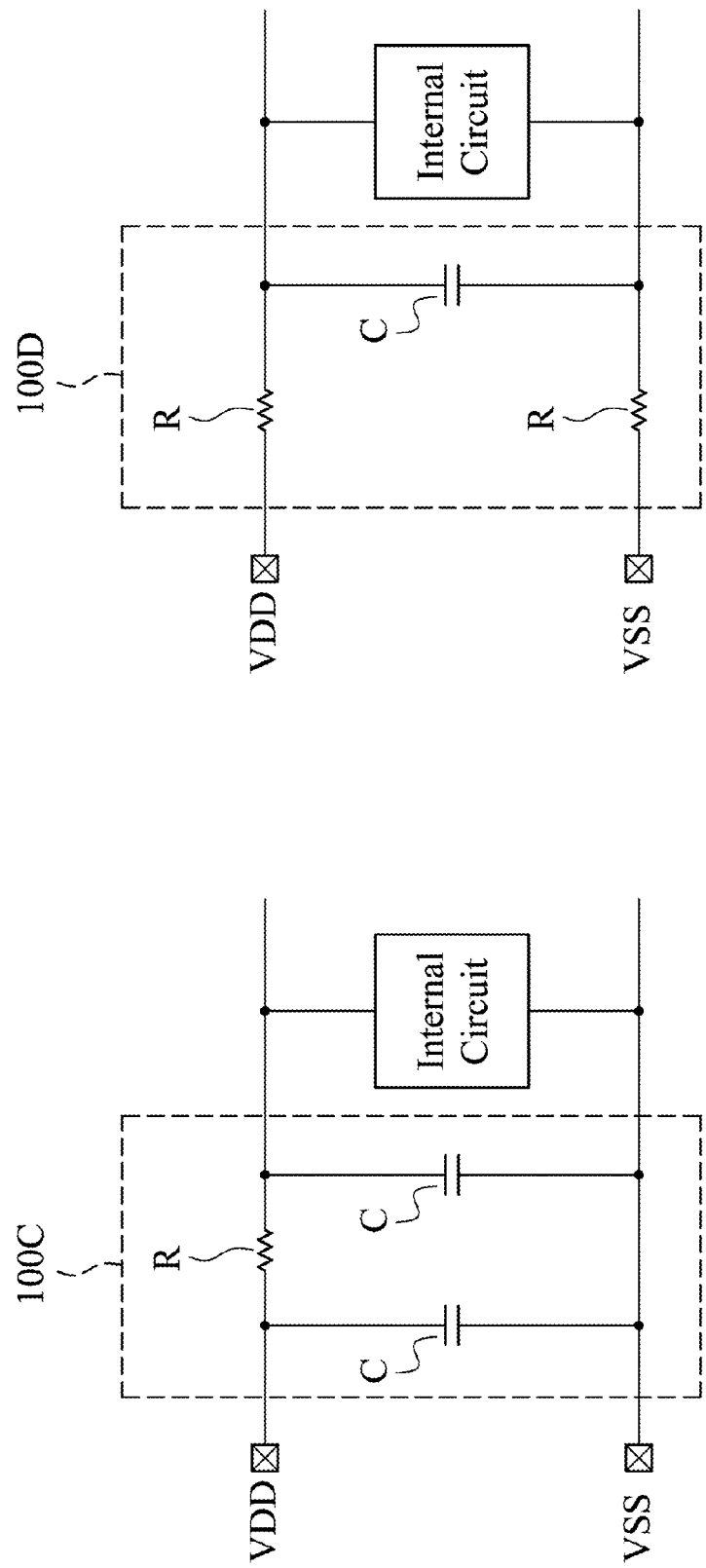
Figure 2:
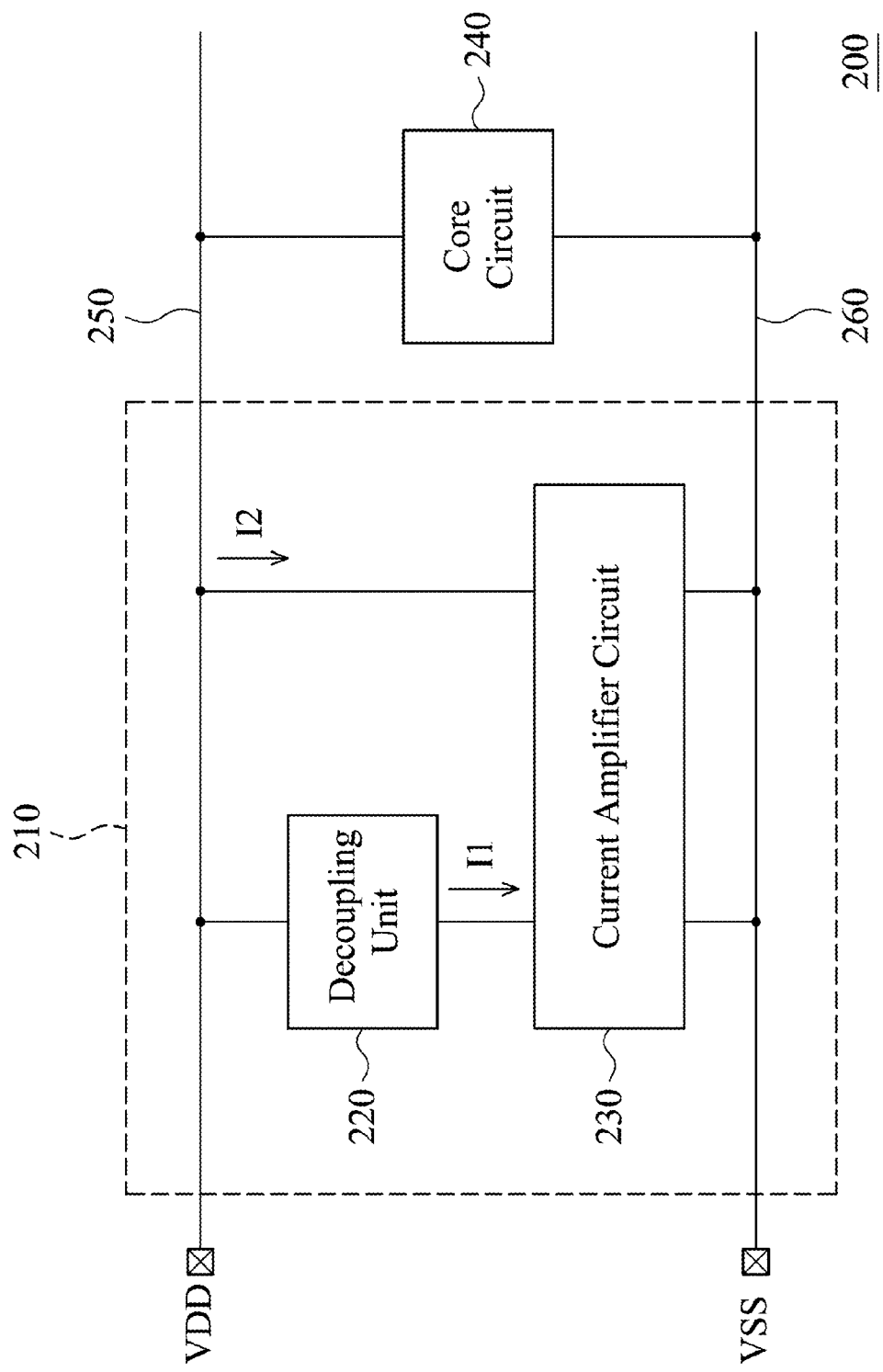
FIG. 2 shows an integrated circuit (IC) according to an embodiment of the invention.

FIG. 2 shows an integrated circuit (IC) 200 according to an embodiment of the invention. The IC 200 comprises a power pad VDD, a ground pad VSS, a noise filter circuit 210 and a core circuit 240, wherein the noise filter circuit 210 and the core circuit 240 connect to the power pad VDD and the ground pad VSS via the power lines 250 and 260, respectively. In a layout, the power pad VDD and ground pad VSS are disposed on the edge of the IC 200 and the noise filter circuit 210 is disposed between the pads VDD/VSS and the core circuit 240. The noise filter circuit 210 comprises a decoupling unit 220 and a current amplifier circuit 230, wherein the decoupling unit 220 is coupled between the current amplifier circuit 230 and the power pad VDD. In the embodiments, the decoupling unit 220 is used to decouple, bypass, or absorb the electrical transient voltage (energy) on the power pad VDD under system-level ESD tests or transient disturbance zapping conditions. Specifically, the decoupling unit 220 functions as a decoupling capacitor. The current amplifier circuit 230 is used to increase the discharge currents I1 and I2 between the power lines 250 and 260. When the discharge currents I1 and I2 increase, an equivalent capacitor value of the decoupling unit 220 is increased by multiple times.

Figure 3:
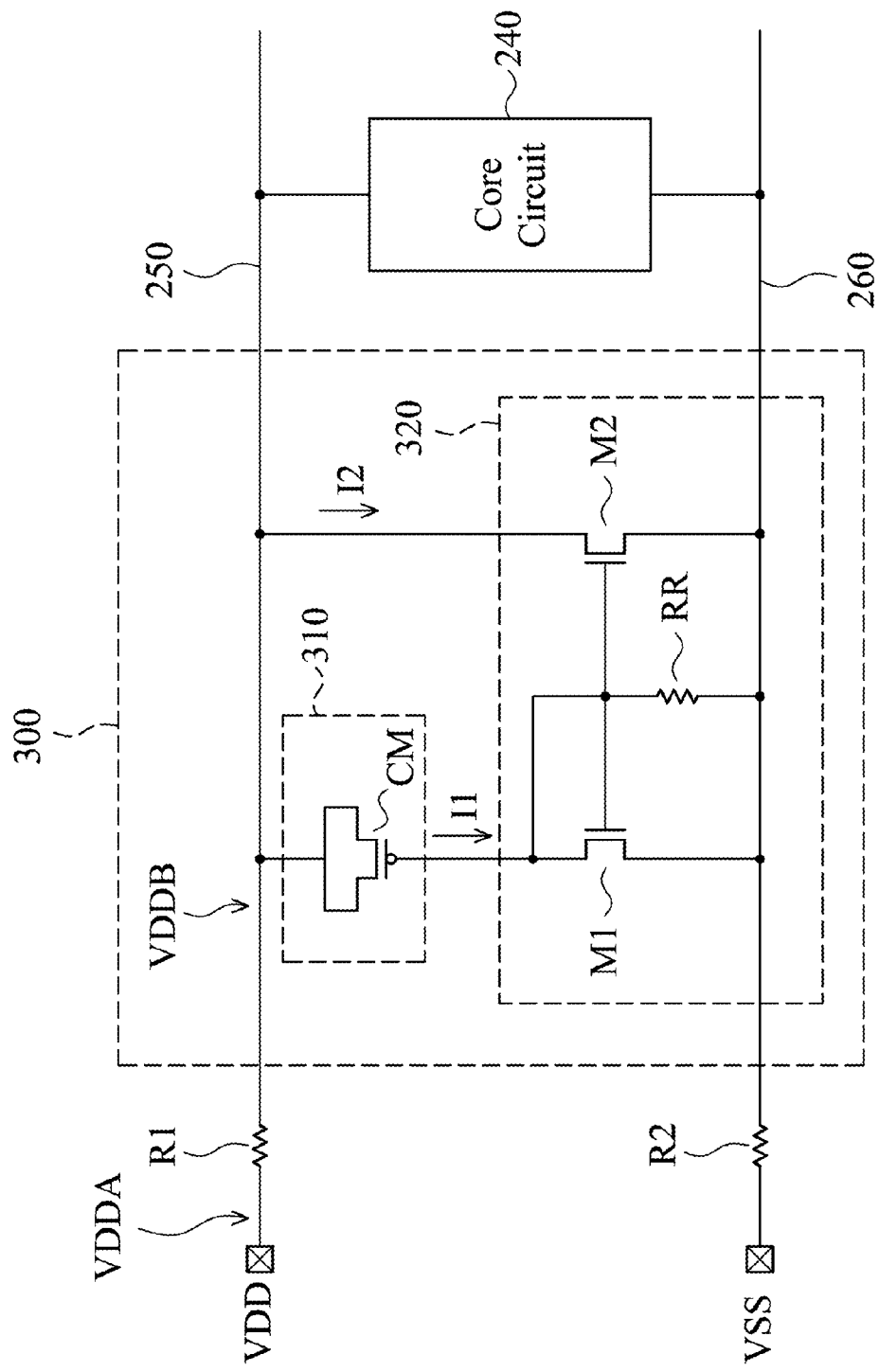
FIG. 3 shows a noise filter circuit according to an embodiment of the invention.

FIG. 3 shows a noise filter circuit 300 according to an embodiment of the invention. In the noise filter circuit 300, a decoupling unit 310 comprises a MOS capacitor CM, and a current amplifier circuit 320 comprises a current mirror formed by two transistors M1 and M2 and a resistor RR. In FIG. 3, the current amplifier circuit 320 drains the current I2 from the power pad VDD through the power line 250 in response to the current I1 from the MOS capacitor CM. Therefore, once a transient voltage (energy) occurs on the power pad VDD and the power line 250, the decoupling unit 310 generates the current I1 to the current amplifier circuit 320, and then the current I2 is drained. Thus, the currents I1 and I2 are shunted to ground through the power line 260 and the ground pad VSS by the current amplifier circuit 320. For example, if a device width ratio of the transistor M2 to the transistor M1 is 4 (M2/M1=4) and a capacitor value of the MOS capacitor CM is 2-pF, the current from the power line 250 to the ground pad VSS is multiplied by 4+1=5 times, i.e. I1+I2=5×I1. Thus, the noise filter circuit 300 is capable of providing a 10-pF equivalent capacitor (i.e. increasing the 2-pF capacitor by a factor of 5) to decouple, bypass, or absorb the electrical transient voltage (energy) on the power pad VDD and the power line 250.

FIG. 4 shows an example diagram of FIG. 3 illustrating a system-level ESD transient through simulation with an underdamped sinusoidal voltage source, wherein the waveforms VDDA and VDDB represent the waveforms obtained on left and right sides of a resistor R1, respectively. As shown, the waveform VDDB is rapidly degraded when the simulated ESD-induced disturbance is applied to the power pad VDD and the ground pad VSS is grounded.

Figure 5A:
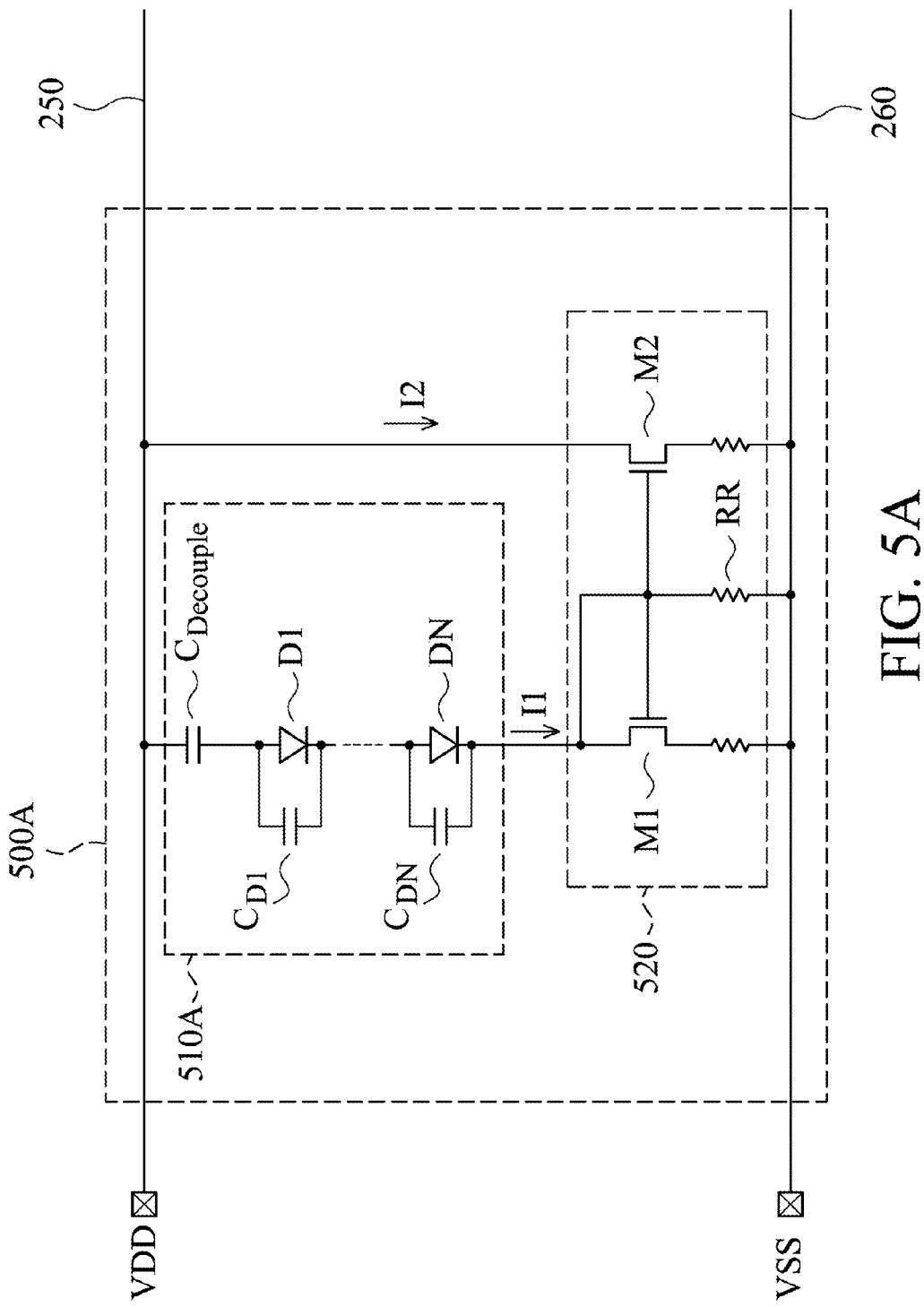
FIGS. 5A-5D show the noise filter circuits according to other embodiments of the invention, respectively.

FIG. 5A shows a noise filter circuit 500A according to another embodiment of the invention. Similarly, the noise filter circuit 500A comprises a decoupling unit 510A and a current amplifier circuit 520. In addition to the capacitor $C_{Decouple}$, the decoupling unit 510A further comprises a forward diode chain, wherein the forward diode chain is formed by a plurality of diodes D1-DN connected in a forward conduction direction from the capacitor $C_{Decouple}$ to the current amplifier circuit 520. In the embodiment, the diodes D1-DN are used to clamp the ESD overstress voltage on the power pad VDD or between the power lines 250 and 260. In another embodiment, the forward diode chain formed by the diodes D1-DN may be connected between the power pad VDD and the capacitor $C_{Decouple}$. By connecting the forward diode chain to the capacitor $C_{Decouple}$, the decoupling unit 510A may provide an equivalent decoupling capacitor value to bypass transient disturbance energy due to the series diode junction capacitors $C_{D1}$-$C_{DN}$. In other words, the capacitor $C_{Decouple}$ and the diode junction capacitors $C_{D1}$-$C_{DN}$ form a decoupling capacitor for the decoupling unit 510A. Thus, the current amplifier circuit 520 provides the discharge currents I1 and I2 between the power lines 250 and 260, and increases the equivalent value of the decoupling capacitor under ESD zapping conditions.

Figure 5B:
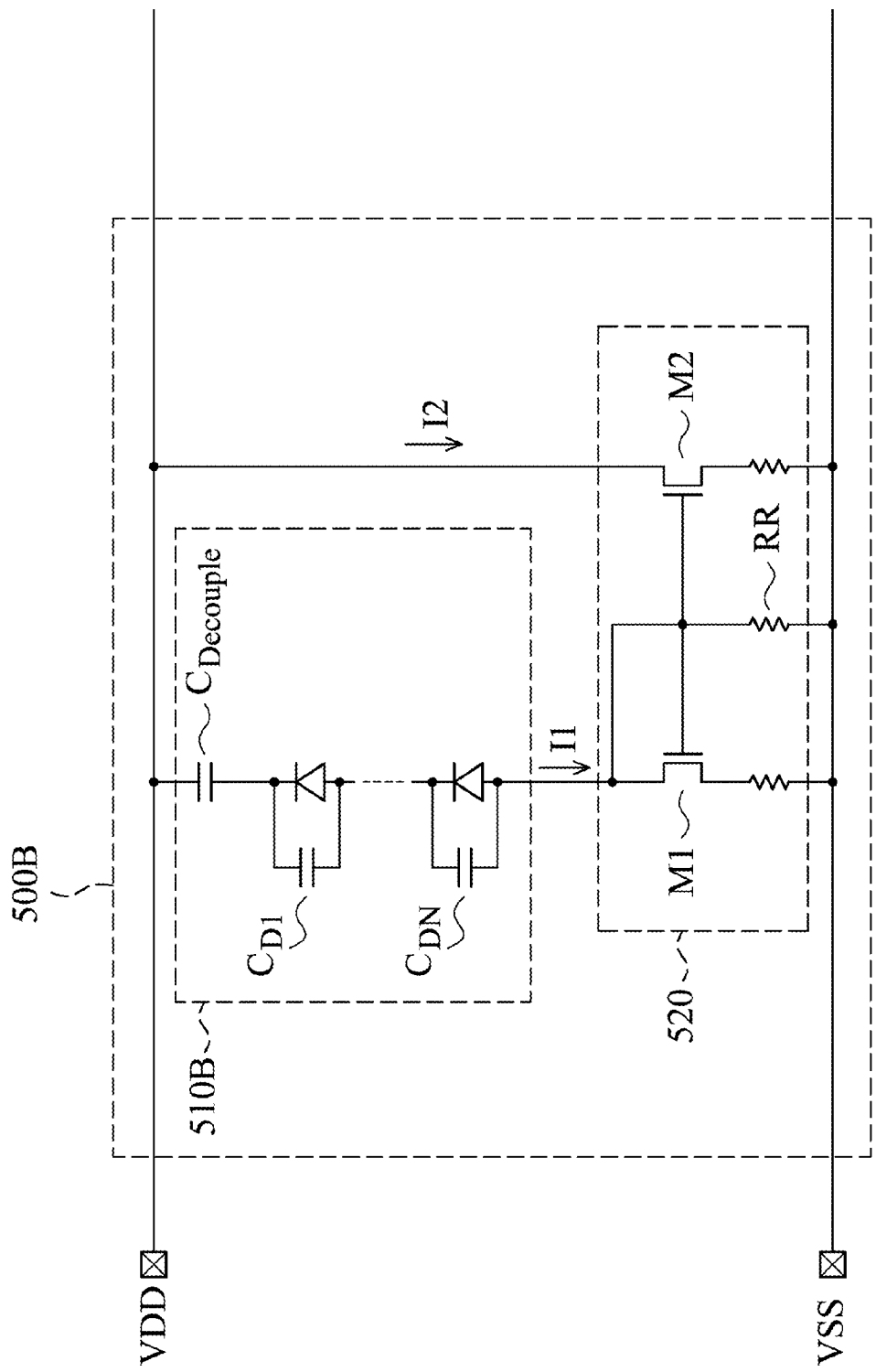
Figure 5C:
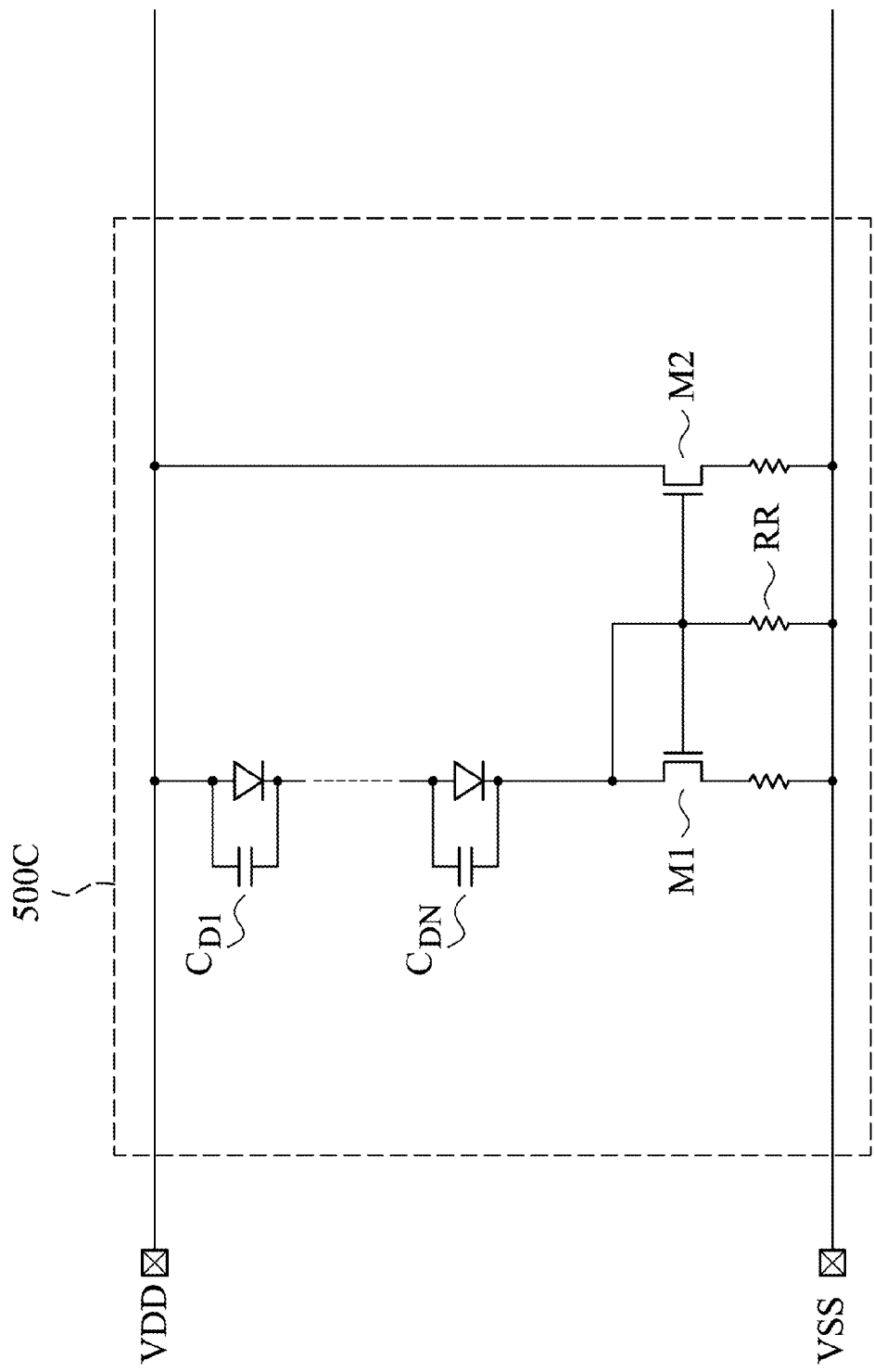
Figure 5D:
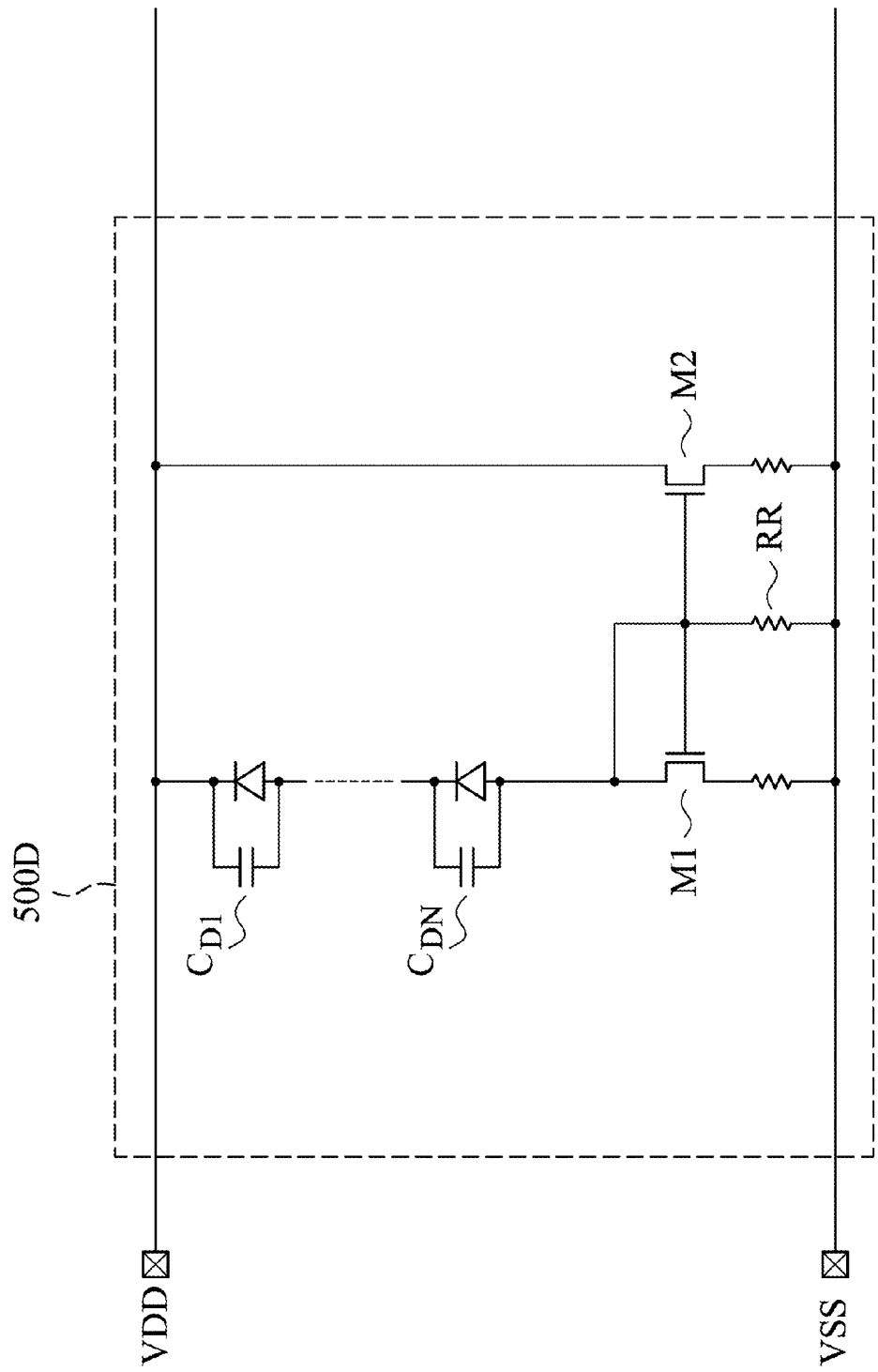

FIG. 5B shows a noise filter circuit 500B according to another embodiment of the invention. Compared with the decoupling unit 510A, the decoupling unit 510B comprises a reverse diode chain, wherein the reverse diode chain is formed by the diodes D1-DN connected in a reverse conduction direction from the capacitor $C_{Decouple}$ to the current amplifier circuit 520. Furthermore, the reverse diode chain may be connected between the power pad VDD and the capacitor $C_{Decouple}$. Similarly, the decoupling unit 510B may provide an equivalent decoupling capacitor value to bypass transient disturbance energy due to the series diode junction capacitors $C_{D1}$-$C_{DN}$. Furthermore, by increasing a current amplifying ratio of the current amplifier circuit 520 appropriately, the capacitor $C_{Decouple}$ may be removed from the decoupling units 510A and 510B, as shown in FIGS. 5C and 5D, thus reducing size of the noise filter circuits 500C and 500D.

As described above, the noise filter circuits of the invention provide a low impedance path between the power pad VDD and the ground pad VSS to efficiently discharge ESD current under ESD stress conditions, thus successfully decoupling or bypassing fast electrical transients during system-level ESD stresses and enhancing the immunity of CMOS IC products against electrical transient disturbances without consuming large areas of silicon.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A noise filter circuit for an integrated circuit (IC), comprising:
   a decoupling unit coupled to a power pad of the IC, generating a first current in response to a transient voltage being on the power pad of the IC; and
   a current amplifier circuit coupled to the decoupling unit and the power pad of the IC, draining a second current from the power pad of the IC according to the first current;
   wherein the current amplifier circuit amplifies the first current to obtain the second current and shunts the first current and the second current to a ground in response to the transient voltage being on the power pad of the IC under an ESD test.

2. The noise filter circuit as claimed in claim 1, wherein the current amplifier circuit comprises a current mirror, and the second current is a multiple of the first current.

3. The noise filter circuit as claimed in claim 1, wherein the decoupling unit comprises a capacitor coupled between the power pad of the IC and the current amplifier circuit.

4. The noise filter circuit as claimed in claim 3, wherein the decoupling unit further comprises at least a diode coupled in a forward conduction direction from the power pad of the IC to the capacitor or from the capacitor to the current amplifier circuit, wherein the capacitor and a junction capacitor of the diode form a decoupling capacitor for decoupling the transient voltage being on the power pad of the IC.

5. The noise filter circuit as claimed in claim 3, wherein the decoupling unit further comprises at least a diode coupled in a reverse conduction direction from the power pad of the IC to the capacitor or from the capacitor to the current amplifier circuit, wherein the capacitor and a junction capacitor of the diode form a decoupling capacitor for decoupling the transient voltage being on the power pad of the IC.

6. The noise filter circuit as claimed in claim 1, wherein the decoupling unit comprises at least a diode coupled in a forward conduction direction from the power pad of the IC to the capacitor or from the capacitor to the current amplifier circuit, wherein a junction capacitor of the diode forms a decoupling capacitor for decoupling the transient voltage being on the power pad of the IC.

7. The noise filter circuit as claimed in claim 1, wherein the decoupling unit comprises at least a diode coupled in a reverse conduction direction from the power pad of the IC to the capacitor or from the capacitor to the current amplifier circuit, wherein a junction capacitor of the diode forms a decoupling capacitor for decoupling the transient voltage being on the power pad of the IC.

8. An integrated circuit (IC), comprising:
a power pad;
a core circuit; and
a noise filter circuit coupled between the power pad and the core circuit, comprising:
a decoupling unit coupled to the power pad, generating a first current in response to a transient voltage being on the power pad; and
a current amplifier circuit coupled to the decoupling unit and the power pad, draining a second current from the power pad according to the first current;
wherein the current amplifier circuit amplifies the first current to obtain the second current and shunts the first current and the second current to a ground in response to the transient voltage being on the power pad under an ESD test.

9. The IC as claimed in claim 8, wherein the current amplifier circuit comprises a current mirror, and the second current is a multiple of the first current.

10. The IC as claimed in claim 8, wherein the decoupling unit comprises a capacitor coupled between the power pad and the current amplifier circuit.

11. The IC as claimed in claim 10, wherein the decoupling unit further comprises at least a diode coupled in a forward conduction direction from the power pad to the capacitor or from the capacitor to the current amplifier circuit, wherein the capacitor and a junction capacitor of the diode form a decoupling capacitor for decoupling the transient voltage being on the power pad.

12. The IC as claimed in claim 10, wherein the decoupling unit further comprises at least a diode coupled in a reverse conduction direction from the power pad to the capacitor or from the capacitor to the current amplifier circuit, wherein the capacitor and a junction capacitor of the diode form a decoupling capacitor for decoupling the transient voltage being on the power pad.

13. The IC as claimed in claim 8, wherein the decoupling unit comprises at least a diode coupled in a forward conduction direction from the power pad to the capacitor or from the capacitor to the current amplifier circuit, wherein a junction capacitor of the diode forms a decoupling capacitor for decoupling the transient voltage being on the power pad.

14. The noise filter circuit as claimed in claim 8, wherein the decoupling unit comprises at least a diode coupled in a reverse conduction direction from the power pad to the capacitor or from the capacitor to the current amplifier circuit, wherein a junction capacitor of the diode forms a decoupling capacitor for decoupling the transient voltage being on the power pad.

* * * * *